(12) United States Patent
Isshiki et al.

(10) Patent No.: US 6,235,862 B1
(45) Date of Patent: May 22, 2001

(54) ADHESIVE SILICONE SHEET, METHOD FOR THE PREPARATION THEREOF AND SEMICONDUCTOR DEVICES

(75) Inventors: Minoru Isshiki; Katsutoshi Mine; Yoshiko Otani; Kimio Yamakawa, all of Chiba Prefecture (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 0 days.

(21) Appl. No.: 09/070,078

(22) Filed: Apr. 30, 1998

(30) Foreign Application Priority Data

Apr. 30, 1997 (JP) .................................................. 9-126376
Jul. 8, 1997 (JP) .................................................. 9-197915

(51) Int. Cl.[7] .......................... H01L 21/44; H01L 21/48; H01L 21/50
(52) U.S. Cl. ................................ 528/15; 528/31; 438/118
(58) Field of Search ............................ 438/118; 528/31, 528/15

(56) References Cited

U.S. PATENT DOCUMENTS

| | | | |
|---|---|---|---|
| 5,145,931 | 9/1992 | Nakayoshi et al. | 528/15 |
| 5,358,983 | * 10/1994 | Morita | 523/455 |
| 5,360,858 | * 11/1994 | Fujiki et al. | 524/434 |
| 5,438,094 | * 8/1995 | Fujiki et al. | 524/730 |
| 5,536,803 | * 7/1996 | Fujiki et al. | 528/15 |
| 5,962,601 | * 10/1999 | Hiroji et al. | 525/478 |
| 5,969,023 | * 10/1999 | Enami et al. | 254/252 |
| 6,010,646 | * 1/2000 | Schleifstein | 252/500 |

\* cited by examiner

*Primary Examiner*—Mary Wilczewski
*Assistant Examiner*—James Park
(74) *Attorney, Agent, or Firm*—Larry A. Milco

(57) ABSTRACT

An adhesive silicone sheet that enroute to its complete cure is inhibited from releasing low-viscosity silicone oil, that provides excellent bond between a semiconductor chip and the corresponding chip attachment site, and that as a consequence of these features supports the fabrication of highly reliable semiconductor devices, The adhesive silicone sheet is produced by a very efficient method which yields an adhesive silicone sheet having particularly good adhesiveness. The siliocone adhesive sheet is used to produce highly reliable semiconductor devices in which the semiconductor chip has been bonded to its attachment site using the subject adhesive silicone sheet.

13 Claims, 3 Drawing Sheets

US 6,235,862 B1

ADHESIVE SILICONE SHEET, METHOD FOR THE PREPARATION THEREOF AND SEMICONDUCTOR DEVICES

FIELD OF THE INVENTION

This invention relates to an adhesive silicone sheet, to a method for the preparation thereof, and to semiconductor devices. More particularly, this invention relates to an adhesive silicone sheet that enroute to its complete cure is inhibited from releasing low-viscosity silicone oil, that provides an excellent bond between a semiconductor chip and the corresponding attachment site, and that as a consequence of these features supports the fabrication of highly reliable semiconductor devices. The invention also relates to a very efficient method for producing this adhesive silicone sheet which yields an adhesive silicone sheet that exhibits a particularly good adhesiveness and that supports the fabrication of highly reliable semiconductor devices. The invention further relates to highly reliable semiconductor devices in which the semiconductor chip has been bonded to its attachment site using the subject adhesive silicone sheet.

BACKGROUND OF THE INVENTION

The silicone adhesives heretofore used to bond semiconductor chips to chip attachment sites have ranged from liquid curable silicone compositions to paste-like curable silicone compositions. These silicone adhesives have taken the form of curable silicone compositions comprising at a minimum an organopolysiloxane having at least 2 silicon-bonded alkenyl groups in each molecule, an organopolysiloxane having at least 2 silicon-bonded hydrogen atoms in each molecule, and a hydrosilylation reaction catalyst. Curable silicone compositions have also been used that additionally contain an adhesion promoter in the form of an organopolysiloxane containing in each molecule at least 1 silicon-bonded alkoxy group and at least 1 silicon-bonded alkenyl group or at least 1 silicon-bonded hydrogen atom (Japanese Patent Application Laid Open (Kokai or Unexamined) Number Hei 3-157474 (157,474/1991)).

However, low-viscosity silicone oil outmigrates from these curable silicone compositions during the time interval leading up to their complete cure, which has caused contamination of the environment surrounding the composition. This low-viscosity silicone oil—because it consists of low degree of polymerization (DP) organopolysiloxane present in the organopolysiloxane base component and/or low DP organopolysiloxane present in the organopolysiloxane added as adhesion promoter—has proven extremely difficult to completely eliminate. As a result, the use of these curable silicone compositions to bond a semiconductor chip to the chip attachment site has resulted in such problems as a reduced wire bondability (joinability) between the bonding pads on the chip and bonding wires or beam leads and a degradation in the reliability of the resulting semiconductor device.

SUMMARY OF THE INVENTION

The present inventors achieved the present invention as a result of extensive research directed to solving the problems described above.

In more specific terms, an object of the present invention is to provide an adhesive silicone sheet that enroute to its complete cure is inhibited from releasing low-viscosity silicone oil, that provides an excellent bond between a semiconductor chip and the corresponding attachment site, and that as a consequence of these features supports the fabrication of highly reliable semiconductor devices. Another object of the present invention is to provide a very efficient method for producing this adhesive silicone sheet which yields an adhesive silicone sheet that exhibits a particularly good adhesiveness and that supports the fabrication of highly reliable semiconductor devices. Yet another object of the present invention is to provide highly reliable semiconductor devices in which the semiconductor chip has been bonded to its attachment site using the subject adhesive silicone sheet.

The adhesive silicone sheet according to the present invention, which is intended for bonding semiconductor chips to their attachment sites, is characterized in that at least the surfaces of the sheet that will contact the chip and chip attachment site are the semi-cured product of a curable silicone composition.

The method according to the present invention for preparing the adhesive silicone sheet for bonding a semiconductor chip to the chip attachment site relates to the preparation of the adhesive silicone sheet by curing a curable silicone composition into a semi-cured state while the composition lies between substrates that are releasable with respect to the semi-cured product of said composition. The method according to the present invention is characterized in that the dielectric constant of at least 1 of said substrates is larger than the dielectric constant of said semi-cured product.

Semiconductor devices according to the present invention are characterized in that the semiconductor chip has been bonded to the chip attachment site using adhesive silicone sheet in which the semi-cured product of a curable silicone composition makes up at least the surfaces of the sheet that contacts the semiconductor chip and chip attachment site.

Figure 1:
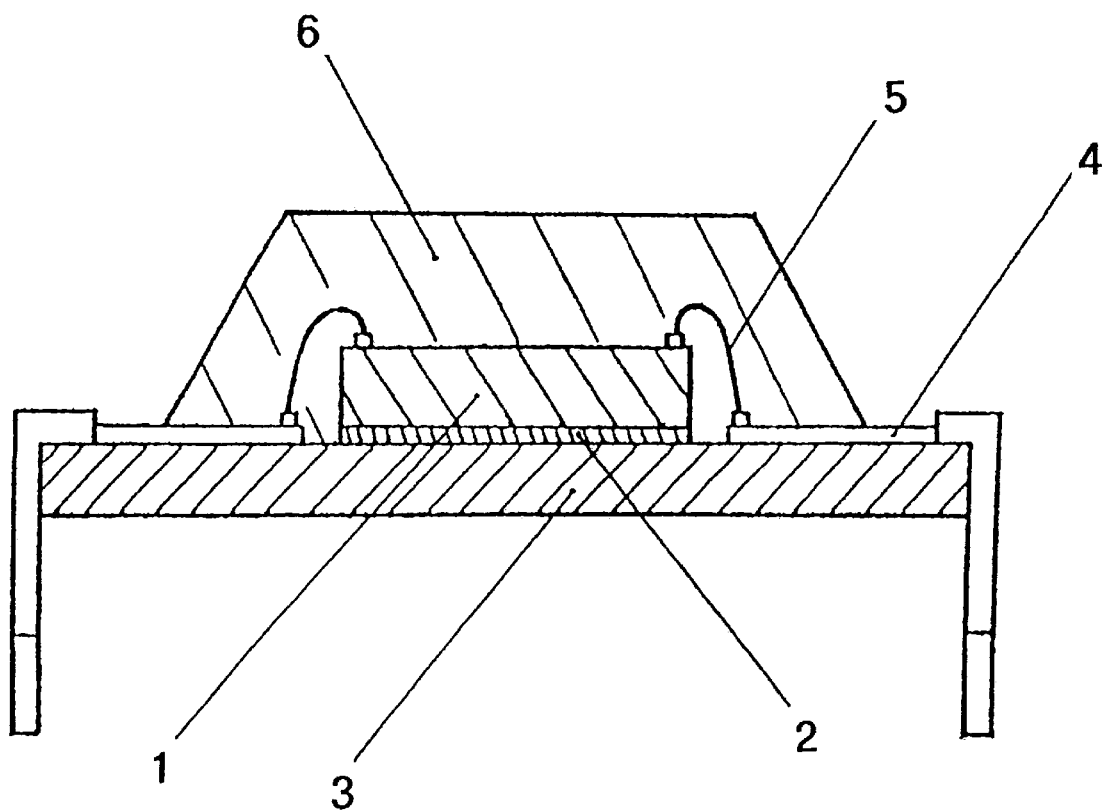
FIG. 1 contains a cross section of a hybrid integrated circuit that is an example of a semiconductor device according to the present invention.

REFERENCE NUMBERS 1 semiconductor chip
2 cured product of the adhesive silicone sheet
3 circuit substrate of glass fiber-reinforced epoxy resin
4 interconnect
5 bonding wire
6 epoxy resin sealant
7 circuit substrate of polyimide resin
8 gold bump
9 silicone resin
A glass fiber-reinforced epoxy resin coupon
B cured product of the adhesive silicone sheet
C low-viscosity silicone oil outmigrated prior to complete cure of the adhesive, silicone sheet
a, b, c, and d: outmigration distances of low-viscosity silicone oil prior to complete cure of the adhesive silicone sheet

DETAILED DESCRIPTION OF THE INVENTION

A detailed explanation will first be provided for the adhesive silicone sheet according to the present invention and the method for its preparation.

The adhesive silicone sheet according to the present invention is intended for bonding semiconductor chips to their chip attachment sites. This sheet is characterized in that at least the surfaces thereof that will come into contact with the chip and corresponding attachment site are the semi-cured product of a curable silicone composition. In another characteristic embodiment, the surfaces of the sheet that will come into contact with the semiconductor chip and corresponding attachment site are the semi-cured product of a curable silicone composition and the interior of the sheet is formed of a silicone rubber element. The term "semi-cured product" refers to adhesive in the B-stage form as defined in JIS K 6800, "Glossary of Terms Used in Adhesives and Adhesion". B-stage refers to an intermediate in the cure of thermosetting resins. In this stage, the resin will soften when heated and will swell when in contact with certain solvents, but will not completely fuse or dissolve. More specifically, "semi-cured product" refers to the curable silicone composition in an incompletely cured stage. Although its state will vary with the particular degree of crosslinking, the fluid curable silicone composition will in general have undergone a loss of fluidity and will have assumed a state ranging from gel-like to rubber-like. The adhesive silicone sheet according to the present invention may be constituted of only the semi-cured product of a curable silicone composition, but may also take a form in which only the surfaces that will contact the semiconductor chip and chip attachment site are said semi-cured product while the sheet interior is formed of a silicone rubber element. The interior silicone rubber element in this latter form of the adhesive silicone sheet can be exemplified by silicone rubber sheet and silicone rubber powder. The shape of the adhesive silicone sheet is not critical, but based on its intended application the sheet preferably has a thickness from 1 to 5,000 µm and particularly preferably from 10 to 1,000 µm.

Methods for fabricating the subject adhesive silicone sheet formed of semi-cured product can be exemplified by (i) converting a curable silicone composition into sheet form and curing this sheet into the semi-cured material; (ii) coating a curable silicone composition uniformly on both surfaces of a silicone rubber sheet and curing the composition into the semi-cured form; and (iii) sheeting a curable silicone composition that contains silicone rubber powder and curing the composition into the semi-cured form. A method for preparing the subject adhesive silicone sheet that provides a particularly good adhesiveness, and hence a preferred method, comprises curing a curable silicone composition into its semi-cured form while the composition lies between substrates that are releasable from the semi-cured form and at least one of which has a dielectric constant larger than the said semi-cured product.

Inorganic substrates, e.g., of metals or metal oxides, and substrates comprising organic resin, e.g., polyimide resin, polyester resin, polyether resin, epoxy resin, phenolic resin, or polyamide resin, are examples of substrates that are releasable with respect to the semi-cured products of the subject curable silicone composition and that have a dielectric constant larger than that of the semi-cured products. Substrates comprising these organic resins are particularly preferred. Substrate comprising organic resin may consist only of organic resin as described above or may be a composite substrate having organic resin as described above at its surface or in its interior. Composite substrates can be exemplified by substrates in which the surface of an organic resin as described above has been coated with a fluororesin or other organic resin. The shape of the substrate is not critical and can be exemplified by block shapes, plate shapes, and films. When in particular a film-form substrate is employed, the substrate can also be used to protect the adhesive silicone sheet, in which case the protective film is preferably peeled off at the point at which the adhesive silicone sheet is applied to the semiconductor chip and corresponding chip attachment site. However, as an alternative to using this substrate as a protective film, the sheet may also be applied to an entirely separate protective film. The dielectric constant of such a separate protective film is not critical, and this separate film can be exemplified by the films of organic resins such as fluororesins, polyethylene resins, and polypropylene resins. Methods for preparing the subject adhesive silicone sheet using a substrate as described above can be exemplified by (i) curing a curable silicone composition into the semi-cured form while the composition is interposed between substrates as described above; (ii) uniformly coating a curable silicone composition on both surfaces of silicone rubber sheet and curing the composition into the semi-cured form while this preparation is interposed between substrates as described above; and (iii) curing a curable silicone composition containing silicone rubber powder into the semi-cured form while the composition is interposed between substrates as described above. Fabrication of the adhesive silicone sheet interposed between substrates as described above is preferably carried out by curing the curable silicone composition into the semi-cured form during or after its molding by a two-roll mill, press, etc.

Hydrosilylation reaction-curing curable silicone compositions are preferred for the curable silicone composition under consideration. Particularly preferred is a curable silicone composition comprising at least (A) organopolysiloxane having at least 2 silicon-bonded alkenyl groups in each molecule, (B) organopolysiloxane having at least 2 silicon-bonded hydrogen atoms in each molecule, (C) siloxane that contains in each molecule at least 1 silicon-bonded alkoxy and at least 1 silicon-bonded alkenyl or at least 1 silicon-bonded hydrogen and/or a mixture of silane or siloxane that contains in each molecule at least 1 silicon-bonded alkoxy with organosiloxane that contains in each molecule at least 1 silicon-bonded hydroxyl group and at least 1 silicon-bonded alkenyl group, and (D) hydrosilylation reaction catalyst.

Component (A), which is the base component of this composition, is organopolysiloxane that contains at least 2 silicon-bonded alkenyl groups in each molecule. The molecular structure of component (A) can be exemplified by straight-chain, partially branched straight-chain, branched-chain, and network molecular structures. The silicon-bonded alkenyl group in component (A) can be exemplified by vinyl, allyl, butenyl, pentenyl, and hexenyl with vinyl being particularly preferred. The alkenyl groups can be bonded at terminal and/or pendant positions on the molecular chain. The non-alkenyl silicon-bonded groups in component (A) can be exemplified by substituted and unsubstituted monovalent hydrocarbon groups, e.g., alkyl such as methyl, ethyl, propyl, butyl, pentyl, hexyl, and heptyl; aryl such as phenyl, tolyl, xylyl, and naphthyl; aralkyl such as benzyl and phenethyl; and halogenated alkyl such as chloromethyl, 3-chloropropyl, and 3,3,3-trifluoropropyl. Methyl and phenyl are particularly preferred among the preceding. The phenyl group preferably makes up at least 1 mole %, particularly preferably from 1 to 60 mole %, and even more preferably from 1 to 30 mole % of the silicon-bonded organic groups in component (A) because the corresponding adhesive silicone sheet has an excellent cold resistance, which leads to additional improvements in the reliability of semiconductor devices fabricated using such adhesive silicone sheet. The viscosity of component (A) is not critical, but this component preferably has a viscosity at 25° C. from 100 to 1,000,000 centipoise.

Component (B), which is a crosslinker for the composition under consideration, is organopolysiloxane that contains at least 2 silicon-bonded hydrogen atoms in each molecule. The molecular structure of component (B) can be exemplified by straight-chain, partially branched straight-chain, branched-chain, cyclic, and network molecular structures. The silicon-bonded hydrogen in component (B) can be bonded at terminal and/or pendant positions on the molecular chain. The non-hydrogen silicon-bonded groups in component (B) can be exemplified by substituted and unsubstituted monovalent hydrocarbon groups, e.g., alkyl such as methyl, ethyl, propyl, butyl, pentyl, hexyl, and heptyl; aryl such as phenyl, tolyl, xylyl, and naphthyl; aralkyl such as benzyl and phenethyl; and halogenated alkyl such as chloromethyl, 3-chloropropyl, and 3,3,3-trifluoropropyl. Methyl and phenyl are particularly preferred among the preceding. The viscosity of component (B) is not critical, but this component preferably has a viscosity at 25° C. from 1 to 100,000 centipoise.

Component (B) should be added in an amount sufficient to cure the composition under consideration, and is preferably added in an amount that provides from 0.5 to 10 moles silicon-bonded hydrogen per 1 mole silicon-bonded alkenyl in the composition. Component (B) is particularly preferably added in an amount that provides from 1 to 3 moles silicon-bonded hydrogen per 1 mole silicon-bonded alkenyl in the composition. The composition under consideration becomes uncurable as the number of moles of SiH per 1 mole silicon-bonded alkenyl in the composition falls below the given range. The heat resistance of the cured product from the composition under consideration progressively declines when the given range is exceeded.

Component (C) imparts an excellent adhesiveness to the cured product from the composition under consideration. Component (C) is siloxane that contains in each molecule at least 1 silicon-bonded alkoxy group and at least 1 silicon-bonded alkenyl group or at least 1 silicon-bonded hydrogen atom, and/or a mixture of silane or siloxane that contains in each molecule at least 1 silicon-bonded alkoxy group with organosiloxane that contains in each molecule at least 1 silicon-bonded hydroxyl group and at least 1 silicon-bonded alkenyl group.

Component (C) encompasses siloxane that contains in each molecule at least 1 silicon-bonded alkoxy group and at least 1 silicon-bonded alkenyl group or at least 1 silicon-bonded hydrogen atom. The molecular structure of this siloxane can be exemplified by straight-chain, partially branched straight-chain, branched-chain, cyclic, and network molecular structures with straight-chain, branched-chain, and network molecular structures being preferred. The silicon-bonded alkenyl group that may be present in the subject siloxane is exemplified by vinyl, allyl, butenyl, pentenyl, and hexenyl with vinyl being preferred. The silicon-bonded alkoxy group present in this siloxane can be exemplified by methoxy, ethoxy, propoxy, butoxy, and methoxyethoxy with methoxy being preferred. The silicon-bonded groups present in this siloxane other than alkoxy and alkenyl or hydrogen can be exemplified by substituted and unsubstituted monovalent hydrocarbon groups, e.g., alkyl such as methyl, ethyl, propyl, butyl, pentyl, hexyl, and heptyl; aryl such as phenyl, tolyl, xylyl, and naphthyl; aralkyl such as benzyl and phenethyl; and halogenated alkyl such as chloromethyl, 3-chloropropyl, and 3,3,3-trifluoropropyl; and by epoxy-functional monovalent organic groups, e.g., glycidoxyalkyl groups such as 3-glycidoxypropyl and 4-glycidoxybutyl, (3,4-epoxycyclohexyl)alkyl groups such as 2-(3,4-epoxycyclohexyl)ethyl and 3-(3,4-epoxycyclohexyl)propyl, and oxiranylalkyl groups such as 4-oxiranylbutyl and 8-oxiranyloctyl. The subject siloxane preferably contains at least one of these epoxy-functional monovalent organic groups in each molecule because this provides an excellent adhesiveness for a variety of substrates. While the viscosity of the siloxane under consideration is not critical, it preferably has a viscosity at 25° C. from 1 to 500 centipoise.

Component (C) also encompasses mixtures of silane or siloxane that contains at least 1 silicon-bonded alkoxy group with organosiloxane that contains in each molecule at least 1 silicon-bonded hydroxyl group and at least 1 silicon-bonded alkenyl group. The silicon-bonded alkoxy group present in the silane can be exemplified by methoxy, ethoxy, propoxy, butoxy, and methoxyethoxy with methoxy being preferred. In addition to alkoxy, the silicon atom in this silane may carry substituted and unsubstituted monovalent hydrocarbon groups, e.g., alkyl such as methyl, ethyl, propyl, butyl, pentyl, hexyl, and heptyl; alkenyl such as vinyl, allyl, butenyl, pentenyl, and hexenyl; aryl such as phenyl, tolyl, xylyl, and naphthyl; aralkyl such as benzyl and phenethyl; and halogenated alkyl such as chloromethyl, 3-chloropropyl, and 3,3,3-trifluoropropyl; and epoxy-functional monovalent organic groups, e.g., glycidoxyalkyl groups such as 3-glycidoxypropyl and 4-glycidoxybutyl, (3,4-epoxycyclohexyl)alkyl groups such as 2-(3,4-epoxycyclohexyl)ethyl and 3-(3,4-epoxycyclohexyl)propyl, and oxiranylalkyl groups such as 4-oxiranylbutyl and 8-oxiranyloctyl. At least one of these epoxy-functional monovalent organic groups is preferably present in each molecule because this provides an excellent adhesiveness for a variety of substrates.

The molecular structure of the siloxane that may be present in component (C) is exemplified by straight-chain, partially branched straight-chain, branched-chain, cyclic, and network molecular structures with straight-chain, branched-chain, and network molecular structures being preferred. The silicon-bonded alkoxy group present in this siloxane can be exemplified by methoxy, ethoxy, propoxy, butoxy, and methoxyethoxy with methoxy being preferred. In addition to alkoxy, the silicon in this siloxane may carry substituted and unsubstituted monovalent hydrocarbon groups, e.g., alkyl such as methyl, ethyl, propyl, butyl, pentyl, hexyl, and heptyl; alkenyl such as vinyl, allyl, butenyl, pentenyl, and hexenyl; aryl such as phenyl, tolyl, xylyl, and naphthyl; aralkyl such as benzyl and phenethyl; and halogenated alkyl such as chloromethyl, 3-chloropropyl, and 3,3,3-trifluoropropyl; and epoxy-functional monovalent organic groups, e.g., glycidoxyalkyl groups such as 3-glycidoxypropyl and 4-glycidoxybutyl, (3,4-epoxycyclohexyl)alkyl groups such as 2-(3,4-epoxycyclohexyl)ethyl and 3-(3,4-epoxycyclohexyl)propyl, and oxiranylalkyl groups such as 4-oxiranylbutyl and 8-oxiranyloctyl. At least one of these epoxy-functional monovalent organic groups is preferably present in each molecule because this provides an excellent adhesiveness for a variety of substrates. While the viscosity of this siloxane is not critical, it preferably has a viscosity at 25° C. from 1 to 500 centipoise.

The molecular structure of the organosiloxane that is the other component in the mixture encompassed by component (C) can be exemplified by straight-chain, partially branched straight-chain, branched-chain, cyclic, and network molecular structures with straight-chain, branched-chain, and network molecular structures being preferred. The silicon-bonded alkenyl group present in this organosiloxane can be exemplified by vinyl, allyl, butenyl, pentenyl, and hexenyl with vinyl being preferred. The non-hydroxyl, non-alkenyl silicon-bonded groups in the subject organosiloxane can be exemplified by substituted and unsubstituted monovalent hydrocarbon groups, e.g., alkyl such as methyl, ethyl, propyl, butyl, pentyl, hexyl, and heptyl; aryl such as phenyl, tolyl, xylyl, and naphthyl; aralkyl such as benzyl and phenethyl; and halogenated alkyl such as chloromethyl, 3-chloropropyl, and 3,3,3-trifluoropropyl. While the viscosity of this organosiloxane is not critical, it preferably has a viscosity at 25° C. from 1 to 500 centipoise.

The ratio of silane or siloxane containing at least 1 silicon-bonded alkoxy group to organosiloxane containing at least 1 silicon-bonded hydroxyl group and at least 1 silicon-bonded alkenyl group in each molecule is not critical, but the silane or siloxane/organosiloxane weight ratio is preferably in the range from 1/99 to 99/1 because this range supports a particularly good adhesiveness.

Preferred for component (C) is organosiloxane that contains in each molecule at least 1 silicon-bonded alkenyl group, at least 1 silicon-bonded alkoxy group, and at least 1 epoxy-functional silicon-bonded monovalent organic group. Particularly preferred for component (C) is organosiloxane with the following average unit formula.

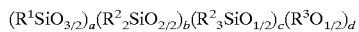

$R^1$ in this formula represents epoxy-functional monovalent organic groups and can be exemplified by glycidoxyalkyl groups such as 3-glycidoxypropyl and 4glycidoxybutyl, (3,4-epoxycyclohexyl)alkyl groups such as 2-(3,4-epoxycyclohexyl)ethyl and 3-(3,4-epoxycyclohexyl)propyl, and oxiranylalkyl groups such as 4-oxiranylbutyl and 8-oxiranyloctyl. Glycidoxyalkyl groups are particularly preferred and the 3-glycidoxypropyl group is even more preferred. $R^2$ in the preceding formula can be exemplified by substituted and unsubstituted monovalent hydrocarbon groups, e.g., alkyl such as methyl, ethyl, propyl, butyl, pentyl, hexyl, and heptyl; alkenyl such as vinyl, allyl, butenyl, pentenyl, and hexenyl; aryl such as phenyl, tolyl, xylyl, and naphthyl; aralkyl such as benzyl and phenethyl; and halogenated alkyl such as chloromethyl, 3-chloropropyl, and 3,3,3-trifluoropropyl. However, at least one of the $R^2$ in this component must be alkenyl. The $R^3$ in the preceding formula represents alkyl and can be exemplified by methyl, ethyl, propyl, butyl, and methoxyethyl with methyl and ethyl being specifically preferred. The subscripts a, b, and d in the preceding formula are positive numbers, while the subscript c is 0 or a positive number.

Component (C) is added in an amount sufficient to equip the cured product from the subject composition with a particularly good adhesiveness. For example, additions in the range from 0.01 to 20 weight parts per 100 weight parts component (A) are preferred, while additions in the range from 0.1 to 10 weight parts per 100 weight parts component (A) are particularly preferred. The adhesiveness of the cured product begins to progressively decline as the addition of component (C) declines below this range. Exceeding the given range has no influence on the adhesiveness, but does cause a progressive decline in the stability of the adhesive silicone sheet.

Component (D) is a catalyst that accelerates the hydrosilylation reaction-based cure of the composition under consideration. Component (D) can be exemplified by the well-known hydrosilylation reaction catalysts, e.g., platinum catalysts, rhodium catalysts, and palladium catalysts. Platinum catalysts are preferred for the good reaction rates they afford. The platinum catalysts can be exemplified by platinum micropowder, platinum black, platinum supported on silica micropowder, platinum supported on active carbon, chloroplatinic acid, alcohol solutions of chloroplatinic acid, olefin complexes of platinum, and alkenylsiloxane complexes of platinum.

Component (D) should be added in sufficient quantity to accelerate the cure of the composition under consideration. When a platinum catalyst is used as component (D), the catalyst will be added so as to provide the subject composition with preferably from 0.01 to 1,000 weight-ppm platinum metal in the catalyst and particularly preferably from 0.1 to 500 weight-ppm platinum metal in the catalyst. The cure rate of the resulting composition declines substantially when the addition of component (D) falls below the given range. Additions above the given range have little effect on the cure rate, but cause such problems as, for example, discoloration.

The composition under consideration is obtained by mixing components (A) to (D) to homogeneity. The semi-cured product can be formed from this composition by inducing the hydrosilylation reaction by heating the composition to room temperature or in the range from room temperature to 200° C. and preferably from room temperature to 120° C. Care must be exercised during heating of the composition to avoid effecting a complete cure of the composition.

A hydrosilylation reaction inhibitor is preferably added to the composition under consideration in order to adjust the hydrosilylation reaction rate of the composition during formation of its semi-cured product and improve the stability of the semi-cured product. The hydrosilylation reaction inhibitor can be exemplified by alkyne alcohols such as 3-methyl-1-butyn-3-ol, 3,5-dimethyl-1-hexyn-3-ol, and phenylbutynol; ene-yne compounds such as 3-methyl-3-penten-1-yne and 3,5-dimethyl-3-hexen-1-yne; and also 1,3,5,7-tetramethyl-1,3,5,7-tetravinylcyclotetrasiloxane, 1,3,5,7-tetramethyl-1,3,5,7-tetrahexenylcyclotetrasiloxane, and benzotriazole. The quantity of addition of the addition reaction inhibitor will vary with the curing conditions imposed on the subject composition, but additions in the range from 0.00001 to 5 weight parts per 100 weight parts component (A) are preferred from a practical standpoint.

Other components that may be added on an optional basis to the curable silicone composition under consideration are exemplified by inorganic fillers such as precipitated silica, wet-process silica, fumed silica, calcined silica, titanium oxide, alumina, glass, quartz, aluminosilicates, iron oxide, zinc oxide, calcium carbonate, carbon black, silicon carbide, silicon nitride, boron nitride, and so forth; these inorganic fillers after treatment with an organosilicon compound such as an organohalosilane, organoalkoxysilane, or organosilazane; organic resin micropowders, such as those of silicone resins, epoxy resins, and fluororesins; particulate fillers of electrically conductive metals such as silver and copper; and also dyes, pigments, flame retardants, and solvents.

Semiconductor devices according to the present invention will now be explained in detail.

Semiconductor devices according to the present invention are characterized in that the semiconductor chip has been bonded to the chip attachment site using adhesive silicone sheet in which the semi-cured product of a curable silicone composition forms at least the surfaces of the sheet that contact the semiconductor chip and chip attachment site. The adhesive silicone sheet described hereinabove is used for the subject semiconductor devices, and the preferred method for preparing this sheet is also as described above. Applicable semiconductor devices can be exemplified by diodes, transistors, thyristors, monolithic integrated circuits, hybrid integrated circuits, large-scale integrated circuits, and very large-scale integrated circuits. With regard to these semiconductor devices, the characteristic feature of a semiconductor device according to the present invention is that the adhesive silicone sheet is used to bond all or part of one surface of the semiconductor chip, e.g., of the diode, transistor, or thyristor, or the memory in, for example, a monolithic integrated circuit, or the semiconductor chip in a hybrid integrated circuit, to the corresponding chip attachment site.

Figure 2:
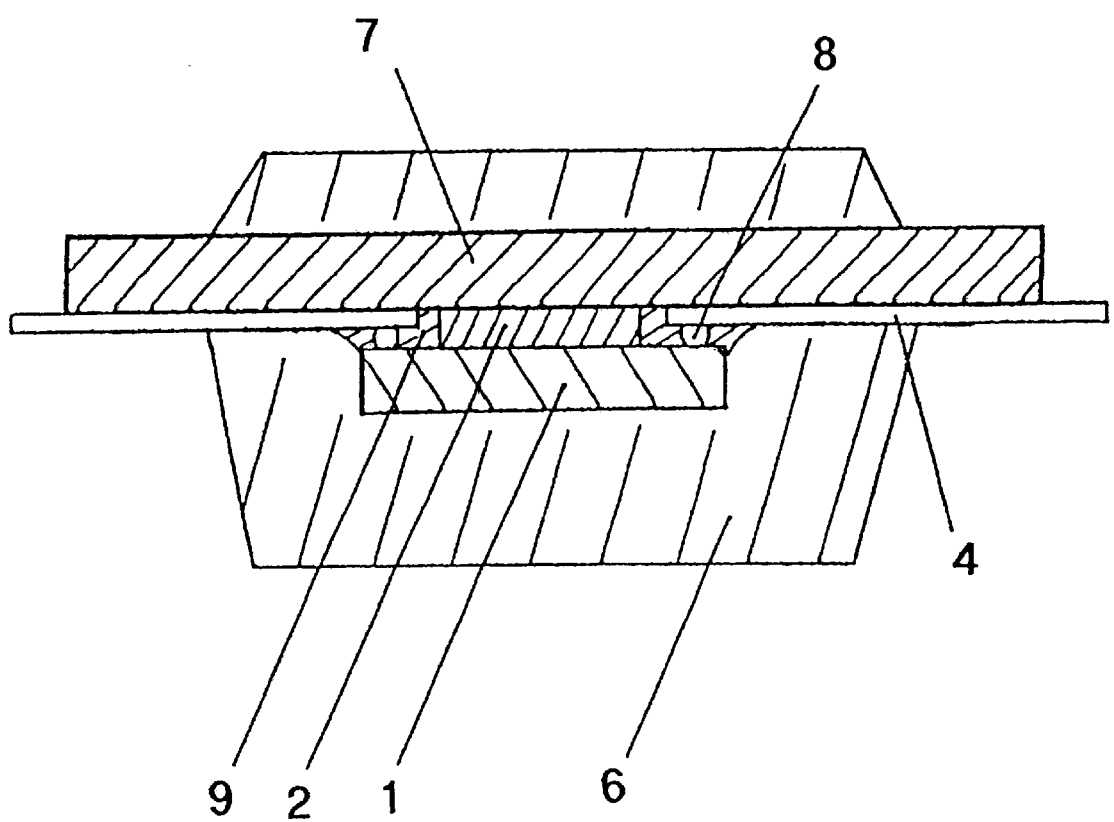
FIG. 2 contains a cross section of a large-scale integrated circuit that is an example of a semiconductor device according to the present invention.

Examples of semiconductor devices according to the present invention are provided in FIG. 1 (cross section of a hybrid integrated circuit) and FIG. 2 (cross section of a large-scale integrated circuit) in support of a more detailed explanation of semiconductor devices according to the present invention. The explanation will continue with reference to these figures. In the semiconductor device shown in FIG. 1, a semiconductor chip 1 has been bonded to a circuit substrate 3 using the adhesive silicone sheet 2, and interconnects 4, which are connected to the outer leads, are electrically connected to the semiconductor chip 1 by bonding wires 5. The circuit substrate 3 can be formed from, for example, ceramic, glass, epoxy resin, polyimide resin, phenolic resin, bakelite resin, melamine resin, glass fiber-reinforced epoxy resin, and so forth. The interconnects 4 can be made of gold, copper, aluminum, silver-palladium, indium-tin oxide (ITO), and so forth. The bonding wires 5 can be made of gold, copper, or aluminum. The semiconductor element 1 is also sealed with a sealant resin 6. The resin making up the sealant resin 6 can be exemplified by epoxy resin, phenolic resin, and polyphenylene sulfide resin. In addition to the semiconductor chip 1, other electronic components, e.g., resistors, capacitors, coils, etc., can be mounted on the circuit substrate 3.

In the semiconductor device depicted in FIG. 2, a semiconductor chip 1 is bonded to a circuit substrate 7 by the cured product 2 of the adhesive silicone sheet, and in this case the semiconductor chip 1 and interconnects 4 on the circuit substrate 7 are electrically connected by bumps 8. The circuit substrate 7 can be made of polyimide resin, ceramic, glass fiber-reinforced epoxy resin, and so forth. The bumps 8 can be, for example, gold, aluminum, or solder. The region around the bumps 8 between the semiconductor chip 1 and circuit substrate 7 can be filled by a resin 9. The resin that will provide this resin 9 can be, for example, a liquid curable silicone resin or a liquid curable epoxy resin. The semiconductor chip 1 can also be sealed with a resin sealant 6 on an optional basis.

Methods for fabricating semiconductor devices according to the present invention will now be explained with reference to the drawings. The semiconductor device shown in FIG. 1 can be fabricated, for example, by first affixing the adhesive silicone sheet onto the semiconductor chip 1 and then affixing the circuit substrate 3 to the sheet, or by first affixing the adhesive silicone sheet onto the circuit substrate 3 and then affixing the semiconductor chip 1 to the sheet. Either sequence is followed by curing the sheet. The sheet is preferably cured by standing at room temperature or by heading to no more than 200° C. Curing is preferably effected while applying pressure to the sheet. After curing, the semiconductor chip 1 and interconnects 4 are electrically connected by bonding wires 5 and as desired the semiconductor chip 1 is then sealed with resin sealant 6.

The semiconductor device shown in FIG. 2 can be fabricated, for example, by first affixing the adhesive silicone sheet to the semiconductor chip 1 and then affixing the circuit substrate 7 to the sheet, or by first affixing the adhesive silicone sheet to the circuit substrate 7 and then affixing the semiconductor chip 1 to the sheet. Either sequence is followed by curing the sheet. The sheet is preferably cured by standing at room temperature or by heating to no more than 200° C. Curing is preferably effected while applying pressure to the sheet. After curing, the semiconductor chip 1 and interconnects 4 are electrically connected by melt bonding by the bumps 8. This is followed by filling the region around the bumps 8 with resin 9, and then as desired by sealing the semiconductor chip 1 with resin sealant 6.

EXAMPLES

The adhesive silicone sheet according to the present invention, the method according to the present invention for preparing this adhesive silicone sheet, and semiconductor devices according to the present invention will be explained in greater detail through working examples. The viscosity values reported in the examples were measured at 25° C. The dielectric constants reported for the semi-cured products from the curable silicone compositions were measured at 25° C. and 1 MHz. The following methods were used to evaluate the presence/absence of outmigration of low-viscosity silicone oil up to complete cure of the adhesive silicone sheet, the adhesiveness of the adhesive silicone sheet, and the reliability of the semiconductor devices.

Figure 3:
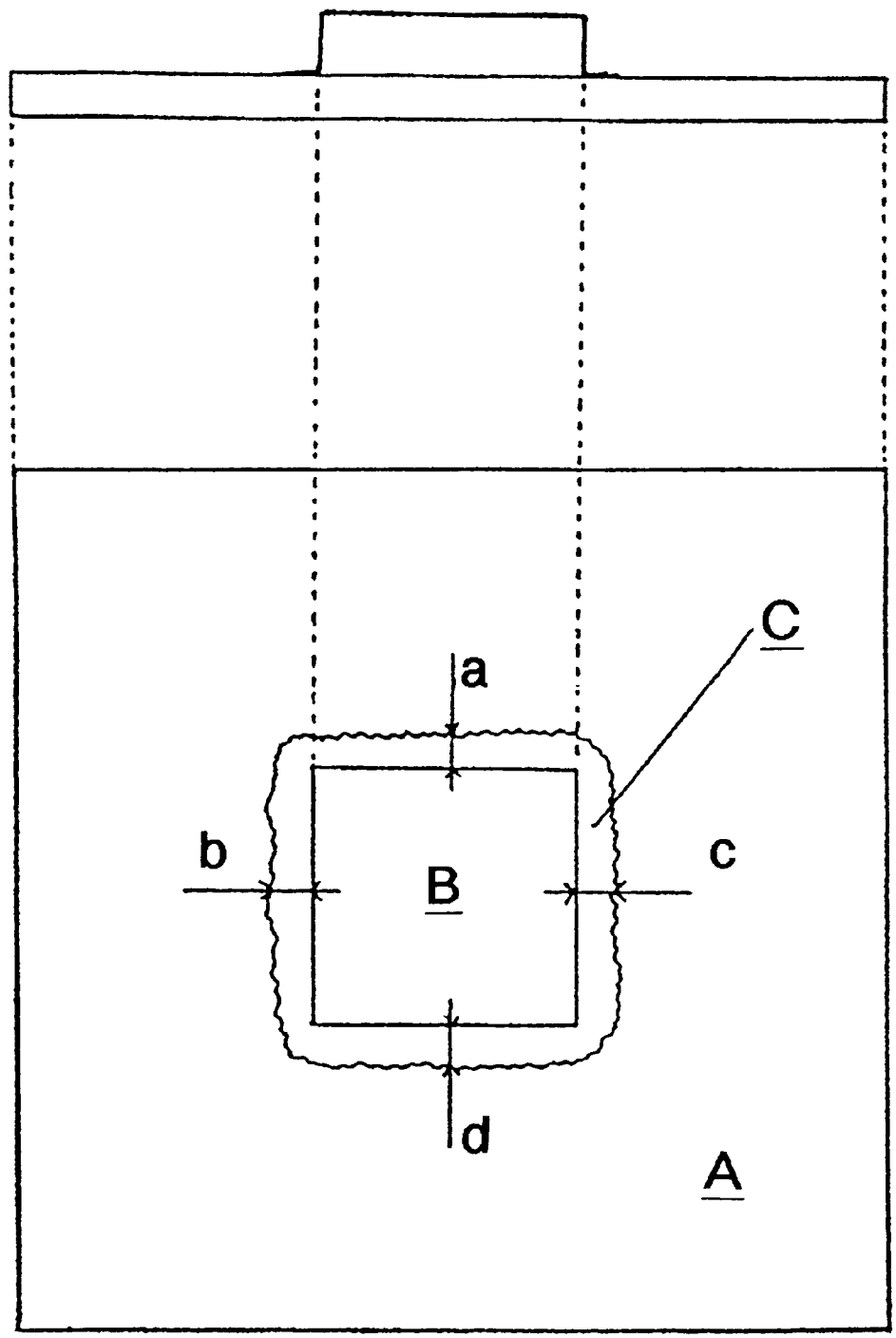
FIG. 3 contains top and side views of the test specimens used in the examples of the invention to evaluate the presence/absence of low-viscosity silicone oil outmigration up to complete cure of the adhesive silicone sheet.

Evaluation of Presence/absence of Outmigration of Low-viscosity Silicone Oil up to Complete Cure of the Adhesive Silicone Sheet The presence/absence of low-viscosity silicone oil outmigration up to complete cure of the adhesive silicone sheet was evaluated using the set up shown in FIG. 3. Ten test specimens were prepared in which the adhesive silicone sheet was affixed on a glass fiber-reinforced epoxy resin coupon A (5 cm×5 cm) to provide a 1 cm×1 cm×1 mm profile. Immediately after the adhesive silicone sheet had been affixed five of these test specimens were submitted to heating for 2 hours in a forced convection oven at 150° C. in order to cure the sheet. The other 5 test specimens were first held for 24 hours at 25° C. after the adhesive silicone sheet had been affixed and were then heated for 2 hours in a forced convection oven at 150° C. to cure the sheet. The average value of the distances (a, b, c, and d) of low-viscosity silicone oil C outmigrated from the cured product B of the adhesive silicone sheet formed on the epoxy resin coupon A was determined for each test specimen. The average value was then calculated for the 5 test specimens fabricated under each curing condition, and this value is reported for the evaluation.

Adhesiveness of the Adhesive Silicone Sheet

The adhesiveness of the adhesive silicone sheets was evaluated as follows. The adhesive silicone sheet was first affixed to a silicon wafer (3 cm×3 cm) and polyimide resin (3 cm×3 cm) to provide a 1 cm×1 cm footprint in each case. The test specimen was fabricated by effecting a complete cure of the sheet by heating for 2 hours in a forced convection oven at 150° C. The adhesiveness of the cured product for the silicon wafer and polyimide resin was investigated by attempting to remove the cured sheet on the test specimen using a metal spatula. A score of + indicates excellent adhesiveness by the cured product, while a score of × indicates that peeling was obtained.

Method 1 for Evaluating Semiconductor Device Reliability

The reliability was evaluated in this method using semiconductor devices as depicted in FIG. 1. This method used a glass fiber-reinforced epoxy resin circuit substrate 3 having interconnects 4 printed on its surface and outer leads at its edges. Forty semiconductor devices were prepared by affixing the adhesive silicone sheet on the circuit substrate 3 and then affixing the semiconductor chip 1 on the sheet. Twenty of these semiconductor devices were taken immediately after the semiconductor chip 1 had been affixed to the circuit substrate 3 using the adhesive silicone sheet and submitted to heating for 2 hours in a forced convection oven at 150° C. The other 20 semiconductor devices were first held for 24 hours at 25° C. after the semiconductor chip 1 had been affixed to the circuit substrate 3 using the adhesive silicone sheet and were thereafter submitted to heating for 2 hours in a forced convection oven at 150° C. The semiconductor chip 1 and interconnects 4 in the semiconductor devices were then electrically connected by bonding wires 5, and the semiconductor devices were subsequently sealed with an epoxy resin sealant 6. The semiconductor devices thereby fabricated were subjected to electrical continuity testing across the outer leads after holding for 1,000 hours or 3,000 hours at 85° C./85% RH. The number of semiconductor devices with defective continuity (defect ratio) was determined for each category.

Method 2 for Evaluating Semiconductor Device Reliability

The reliability was evaluated in this method using semiconductor devices as depicted in FIG. 2. In this method, 40 semiconductor devices were fabricated by affixing the adhesive silicone sheet to a polyimide resin circuit substrate 7, affixing the semiconductor element 1 to the sheet, and electrically connecting the semiconductor element 1 to the interconnects 4 on the circuit substrate 7 by gold bumps 8. Twenty of these semiconductor devices were taken immediately after the semiconductor chip 1 had been affixed to the circuit substrate 7 using the adhesive silicone sheet and submitted to heating for 2 hours in a forced convection oven at 150° C. The other 20 semiconductor devices were first held for 24 hours at 25° C. after the semiconductor chip 1 had been affixed to the circuit substrate 7 using the adhesive silicone sheet and were thereafter submitted to heating for 2 hours in a forced convection oven at 150° C. The region in these semiconductor devices around the bumps 8 between the semiconductor chip 1 and circuit substrate 7 was then filled with silicone resin 9 and the semiconductor element 1 was thereafter sealed with an epoxy resin sealant. The semiconductor devices thereby fabricated were subjected to electrical continuity testing across the outer leads after holding for 1,000 hours or 3,000 hours at 85° C./85% RH. The number of semiconductor devices with defective continuity (defect ratio) was determined for each category.

Method 3 for Evaluating Semiconductor Device Reliability

The reliability was evaluated in this method using semiconductor devices as depicted in FIG. 2. In this method, 40 semiconductor devices were fabricated by affixing the adhesive silicone sheet to a polyimide resin circuit substrate 7, affixing the semiconductor element 1 to the sheet, and then electrically connecting the semiconductor element 1 to the interconnects 4 on the circuit substrate 7 by gold bumps 8. Twenty of these semiconductor devices were taken immediately after the semiconductor chip 1 had been affixed to the circuit substrate 7 using the adhesive silicone sheet and submitted to heating for 2 hours in a forced convection oven at 150° C. The other 20 semiconductor devices were first held for 24 hours at 25° C. after the semiconductor chip 1 had been affixed to the circuit substrate 7 using the adhesive silicone sheet and were thereafter submitted to heating for 2 hours in a forced convection oven at 150° C. The region in these semiconductor devices around the bumps 8 between the semiconductor chip 1 and circuit substrate 7 was then filled with silicone resin 9 and the semiconductor element 1 was thereafter sealed with an epoxy resin sealant. The fabricated semiconductor devices were submitted to thermal cycle testing for 1,000 or 3,000 cycles (1 cycle=holding for 10 minutes at −55° C. then immediately thereafter holding for 10 minutes at +125° C.), after which the semiconductor devices were subjected to electrical continuity testing across the outer leads. The number of semiconductor devices with defective continuity (defect ratio) was determined for each category.

Example 1

The following were mixed to homogeneity to give a hydrosilylation reaction-curing curable silicone composition with a viscosity of 25,000 centipoise: component (A): 72 weight parts dimethylvinylsiloxy-endblocked dimethylpolysiloxane with a viscosity of 40,000 centipoise and a silicon-bonded vinyl content of 0.08 weight %+15 weight parts dimethylvinylsiloxy-endblocked dimethylsiloxane-methylvinylsiloxane copolymer with a viscosity of 6,000 centipoise and a silicon-bonded vinyl content of 0.84 weight %; component (B): 3 weight parts trimethylsiloxy-endblocked dimethylsiloxane-methylhydrogensiloxane copolymer with a viscosity of 5 centipoise and a silicon-bonded hydrogen content of 0.7 weight %; component (C): 1.0 weight part of the 1:1 (weight ratio) mixture of 3-glycidoxypropyltrimethoxysilane and dimethylhydroxysiloxy-endblocked methylvinylpolysiloxane with a viscosity of 40 centipoise and a silicon-bonded vinyl content of 31 weight %; component (D): the 1,3-divinyl-1,1,3,3-tetramethyldisiloxane complex of platinum, in an amount providing 5 weight-ppm platinum metal in the complex referred to the composition; and 0.01 weight part 3-phenyl-1-butyn-3-ol as addition reaction inhibitor.

The curable silicone composition was placed between 100 μm-thick sheets of polyimide resin (dielectric constant=3.5) and processed to a composition thickness of 200 μm using a stainless steel two-roll mill with an adjusted clearance. An adhesive silicone sheet comprising the semi-cured product of the composition was then fabricated by heating for 30 minutes in a forced convection oven at 80° C. This adhesive silicone sheet could be easily peeled from the polyimide resin sheets; had a uniform thickness of about 200 μm; and had a dielectric constant of 2.8. Using the methods described above this sheet was evaluated for adhesiveness, semiconductor device reliability, and the presence/absence of outmigration of low-viscosity silicone oil up to-complete cure. The results are reported in Table 1.

Example 2

Curable silicone composition as prepared in Example 1 was inserted between 100 μm-thick fluororesin sheets (dielectric constant=2.1) and adhesive silicone sheet comprising the semi-cured product of the composition was then fabricated using this set up. The resulting adhesive silicone sheet could be easily peeled from the fluororesin sheets; had a uniform thickness of about 200 μm; and had a dielectric constant of 2.8. Using the methods described above this sheet was evaluated for adhesiveness, semiconductor device reliability, and the presence/absence of outmigration of low-viscosity silicone oil up to complete cure. The results are reported in Table 1.

Comparative Example 1

The curable silicone composition in Example 2 was heated for 2 hours in a forced convection oven at 150° C. to produce an adhesive silicone sheet in which the composition was completely cured. This adhesive silicone sheet was submitted to evaluation by the methods described above; however, the semiconductor device reliability evaluation could not be carried out on this sheet because it was entirely devoid of adhesiveness.

Example 3

A curable silicone composition with a viscosity of 26,000 centipoise was prepared as described in Example 1, but in this case replacing the component (C) used in the curable silicone composition of Example 1 with 1 weight part trimethylsiloxy-endblocked methylhydrogenpolysiloxane with a viscosity of 20 centipoise and a silicon-bonded hydrogen content of 1.5 weight %. An adhesive silicone sheet was fabricated as in Example 1 from the resulting curable silicone composition. This adhesive silicone sheet could be easily peeled from the polyimide resin sheets; had a uniform thickness of about 200 μm; and had a dielectric constant of 2.8. Using the methods described above this sheet was evaluated for adhesiveness, semiconductor device reliability, and the presence/absence of outmigration of low-viscosity silicone oil up to complete cure. The results are reported in Table 1.

Example 4

Curable silicone composition as prepared in Example 1 was inserted between 125 μm-thick sheets with a dielectric constant of 3.3 consisting of fluororesin-coated polyimide resin, and adhesive silicone sheet comprising the semi-cured product of the composition was then fabricated as described in Example 1. The resulting adhesive silicone sheet could be easily peeled from the fluororesin-coated polyimide resin sheets; had a uniform thickness of about 200 μm; and had a dielectric constant of 2.8. Using the methods described above this sheet was evaluated for adhesiveness, semiconductor device reliability, and the presence/absence of outmigration of low-viscosity silicone oil up to complete cure. The results are reported in Table 1.

Example 5

Curable silicone composition as prepared in Example 1 was placed between 100 μm-thick fluororesin sheets (dielectric constant=2.1) and processed to a composition thickness of 100 μm using a stainless steel two-roll mill with an adjusted clearance. This composition was subjected to a complete cure by heating for 2 hours in a forced convection oven at 150° C. to give a silicone rubber sheet. This silicone rubber sheet had a JIS A durometer of 40.

Both surfaces of this silicone rubber sheet were then uniformly coated with curable silicone composition as prepared in Example 1. These two surfaces were sandwiched between 100 μm-thick polyimide resin sheets (dielectric constant=3.5). An overall thickness of 200 μm was subsequently obtained by passage through a stainless steel two-roll mill with an adjusted clearance. Heating for 30 minutes in a forced convection oven at 80° C. then gave an adhesive silicone sheet in which the semi-cured product from the subject composition was formed on both surfaces of the silicone rubber sheet. This adhesive silicone sheet could be easily peeled from the polyimide resin sheets; had a uniform thickness of about 200 μm; and had a dielectric constant of 2.8. Using the methods described above this sheet was evaluated for adhesiveness, semiconductor device reliability, and the presence/absence of outmigration of low-viscosity silicone oil up to complete cure. The results are reported in Table 1.

Example 6

A curable silicone composition with a viscosity of 25,000 centipoise was prepared as described in Example 1, but in this case replacing the component ((C) used in the curable silicone composition of Example 1 with 1.0 weight part organosiloxane having the following average unit formula, a viscosity of 20 centipoise, and a silicon-bonded vinyl content of 16 weight %:

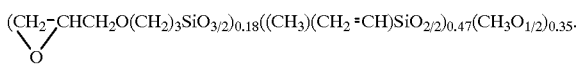

An adhesive silicone sheet was fabricated as in Example 1 from the resulting curable silicone composition. This adhesive silicone sheet could be easily peeled from the polyimide resin sheets; had a uniform thickness of about 200 μm; and had a dielectric constant of 2.8. Using the methods described above this sheet was evaluated for adhesiveness, semiconductor device reliability, and the presence/absence of outmigration of low-viscosity silicone oil up to complete cure. The results are reported in Table 1.

Comparative Example 2

The curable silicone composition of Example 1 was employed without semi-curing. Using the methods described above this composition was evaluated for adhesiveness, semiconductor device reliability, and the presence/absence of outmigration of low-viscosity silicone oil up to complete cure. The results are reported in Table 1. However, in the semiconductor device reliability evaluations, after the curable silicone composition had stood at 25° C. for 24 hours the outflow over the circuit substrate 3 and circuit substrate 7 was so broad that this semiconductor device reliability evaluation could not be carried out.

Example 7

The following were mixed to homogeneity to give a hydrosilylation reaction-curing curable silicone composition with a viscosity of 25,000 centipoise: component (A): 72 weight parts dimethylvinylsiloxy-endblocked dimethylsiloxane-methylphenylsiloxane copolymer with a viscosity of 40,000 centipoise, a silicon-bonded vinyl content of 0.08 weight %, and a phenyl content of 5 mole % of the total silicon-bonded organic groups+15 weight parts methylphenylvinylsiloxy-endblocked dimethylsiloxane-methylvinylsiloxane-methylphenylsiloxane copolymer with a viscosity of 6,000 centipoise, a silicon-bonded vinyl content of 0.84 weight %, and a phenyl content of 5 mole % of the total silicon-bonded organic groups; component (B): 3 weight parts trimethylsiloxy-endblocked dimethylsiloxane-methylhydrogensiloxane copolymer with a viscosity of 5 centipoise and a silicon-bonded hydrogen content of 0.7 weight %; component (C): 1.0 weight part of the 1:1 (weight ratio) mixture of glycidoxypropyltrimethoxysilane and dimethylhydroxysiloxy-endblocked methylvinylpolysiloxane with a viscosity of 40 centipoise and a silicon-bonded vinyl content of 31 weight %; component (D): the 1,3-divinyl-1,1,3,3-tetramethyldisiloxane complex of platinum, in an amount providing 5 weight-ppm platinum metal in the complex referred to the composition; and 0.01 weight part 3-phenyl-1-butyn-3-ol as addition reaction inhibitor.

The curable silicone composition was placed between 100 μm-thick sheets of polyimide resin (dielectric constant=3.5) and processed to a composition thickness of 200 μm using a stainless steel two-roll mill with an adjusted clearance. An adhesive silicone sheet comprising the semi-cured product of the composition was then fabricated by heating for 30 minutes in a forced convection oven at 80° C. This adhesive silicone sheet could be easily peeled from the polyimide resin sheets; had a uniform thickness of about 200 μm; and had a dielectric constant of 2.9. Using the methods described above this sheet was evaluated for adhesiveness, semiconductor device reliability, and the presence/absence of outmigration of low-viscosity silicone oil up to complete cure. The results are reported in Table 1.

The adhesive silicone sheet according to the present invention is inhibited from releasing low-viscosity silicone oil prior to its complete cure and provides an excellent bond between a semiconductor chip and the chip attachment site and as a consequence supports the fabrication of highly reliable semiconductor devices. The method according to the present invention for the preparation of the subject adhesive silicone sheet is a highly efficient method for fabricating a particularly strongly adhesive silicone sheet that supports the fabrication of highly reliable semiconductor devices. Semiconductor devices according to the present invention are highly reliable because the semiconductor chip there is bonded to its attachment site by the subject adhesive silicone sheet.

TABLE 1

|  |  | present invention | | | | | | | comparative examples | |
|---|---|---|---|---|---|---|---|---|---|---|
|  |  | Ex. 1 | Ex. 2 | Ex. 3 | Ex. 4 | Ex. 5 | Ex. 6 | Ex. 7 | Comp. Ex. 1 | Comp. Ex. 2 |
| adhesiveness for | silicon wafer | + | + | + | + | + | + | + | × | + |
|  | polyimide resin | + | + | + | + | + | + | + | × | + |
| silicone oil outmigration (mm) | | | | | | | | | | |
| for curing immediately after affixing | | 0 | 0 | 0 | 0 | 0 | 0 | 0 | 0 | 4.5 |
| for curing after standing for 24 hours | | 0 | 0 | 0 | 0 | 0 | 0 | 0 | 0 | >10 |
| semiconductor device reliability (method 1) (defect ratio in %) | | | | | | | | | | |
| for curing immediately after affixing | | | | | | | | | | |
| after 1000 hours | | 0 | 0 | 0 | 0 | 0 | 0 | 0 | – | 55 |
| after 3000 hours | | 0 | 10 | 5 | 0 | 0 | 0 | 0 | – | 60 |
| for curing after standing for 24 hours | | | | | | | | | | |
| after 1000 hours | | 0 | 0 | 0 | 0 | 0 | 0 | 0 | – | – |
| after 3000 hours | | 0 | 5 | 5 | 0 | 0 | 0 | 0 | – | – |
| semiconductor device reliability (method 2) (defect ratio in %) | | | | | | | | | | |
| for curing immediately after affixing | | | | | | | | | | |
| after 1000 hours | | 0 | 0 | 0 | 0 | 0 | 0 | 0 | – | 70 |
| after 3000 hours | | 0 | 5 | 5 | 0 | 0 | 0 | 0 | – | 75 |
| for curing after standing for 24 hours | | | | | | | | | | |
| after 1000 hours | | 0 | 0 | 0 | 0 | 0 | 0 | 0 | – | – |
| after 3000 hours | | 0 | 10 | 5 | 0 | 0 | 0 | 0 | – | – |
| semiconductor device reliability (method 3) (defect ratio in %) | | | | | | | | | | |
| for curing immediately after affixing | | | | | | | | | | |
| after 1000 cycles | | 0 | – | – | – | – | – | 0 | – | – |
| after 3000 cycles | | 0 | – | – | – | – | – | 0 | – | – |
| for curing after standing for 24 hours | | | | | | | | | | |
| after 1000 cycles | | 0 | – | – | – | – | – | 0 | – | – |
| after 3000 cyces | | 5 | – | – | – | – | – | 0 | – | – |

What we claim is:

1. An adhesive silicone sheet for bonding a semiconductor chip to a chip attachment site, wherein at least the surfaces of the sheet that contact the semiconductor chip and attachment site are a semi-cured product of a curable silicone composition.

2. The adhesive silicone sheet according to claim 1, wherein the sheet contains a silicone rubber sheet interposed between the surfaces.

3. The adhesive silicone sheet according to claim 1, wherein the curable silicone composition is a hydrosilylation reaction-curing silicone composition.

4. The adhesive silicone sheet according to claim 3, wherein the hydrosilylation reaction-curing silicone composition comprises:

(A) an organopolysiloxane having at least 2 silicon-bonded alkenyl groups in each molecule, (B) an organopolysiloxane having at least 2 silicon-bonded hydrogen atoms in each molecule, (C) a siloxane-containing component for imparting adhesion, and (D) a hydrosilylation reaction catalyst.

5. The adhesive silicone sheet according to claim 4, wherein the siloxane-containing component is a siloxane having at least 1 silicon-bonded alkoxy group and at least 1 silicon-bonded alkenyl group in each molecule.

6. The adhesive silicone sheet according to claim 5, wherein the siloxane also contains at least 1 epoxy-functional monovalent organic group in each molecule.

7. The adhesive silicone sheet according to claim 6, wherein the siloxane is an organosiloxane having the average unit formula

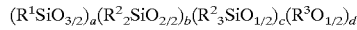

wherein $R^1$ represents the epoxy-functional monovalent organic group, $R^2$ represents substituted and unsubstituted monovalent hydrocarbon groups with the proviso that at least one $R^2$ in the siloxane is alkenyl, $R^3$ represents alkyl, a is a positive number, b is a positive number, c is 0 or a positive number, d is a positive number.

8. The adhesive silicone sheet according to claim 4, wherein the siloxane-containing component is a siloxane having at least 1 silicon-bonded alkoxy group and a least 1 silicon-bonded hydrogen atom in each molecule.

9. The adhesive silicone sheet according to claim 8, wherein the siloxane also contains at least 1 epoxy-functional monovalent organic group in each molecule.

10. The adhesive silicone sheet according to claim 4, wherein the siloxane-containing component is a mixture of a silane having at least 1 silicon-bonded alkoxy group in each molecule and an organosiloxane having at least 1 silicon-bonded hydroxyl group and at least 1 silicon-bonded alkenyl group in each molecule.

11. The adhesive silicone sheet according to claim 10, wherein the silane also contains at least 1 epoxy-functional monovalent organic group in each molecule.

12. The adhesive silicone sheet according to claim 4, wherein the siloxane-containing component is a mixture of a siloxane having at least 1 silicon-bonded alkoxy group in each molecule and an organosiloxane having at least 1 silicon-bonded hydroxyl group and at least 1 silicon-bonded alkenyl group in each molecule.

13. The adhesive silicone sheet according to claim 12, wherein the siloxane also contains at least 1 epoxy-functional monovalent organic group in each molecule.

* * * * *